United States Patent

Wada et al.

Patent Number: 5,567,469
Date of Patent: *Oct. 22, 1996

[54] PROCESS FOR PRODUCING CHALCOPYRITE TYPE COMPOUND THIN FILM

[75] Inventors: Takahiro Wada, Katano; Mikihiko Nishitani, Nara; Takayuki Negami, Katano, all of Japan

[73] Assignee: Matsuhita Electric Co., Ltd., Kadoma, Japan

[*] Notice: The term of this patent shall not extend beyond the expiration date of Pat. No. 5,445,847.

[21] Appl. No.: 458,015

[22] Filed: Jun. 1, 1995

Related U.S. Application Data

[63] Continuation of Ser. No. 138,213, Oct. 20, 1993, abandoned.

[30] Foreign Application Priority Data

Oct. 30, 1992 [JP] Japan ................... 4-292460

[51] Int. Cl.$^6$ ................... B05D 1/36
[52] U.S. Cl. ........... 427/74; 427/248.1; 427/255.2; 427/76; 423/508; 423/511; 136/260
[58] Field of Search ............ 427/74, 76, 248.1, 427/255.2; 423/508, 511; 136/260

[56] References Cited

U.S. PATENT DOCUMENTS

| | | | |
|---|---|---|---|
| 4,335,266 | 6/1982 | Mickelsen et al. | 136/260 |
| 4,465,575 | 8/1984 | Love et al. | 204/192 S |
| 4,581,108 | 4/1986 | Kapur et al. | 204/37.1 |
| 4,611,091 | 9/1986 | Choudary et al. | 136/260 |

FOREIGN PATENT DOCUMENTS

| | | |
|---|---|---|
| 318315 | 5/1989 | European Pat. Off. . |
| 3822073 | 1/1990 | Germany . |
| WO9015445 | 12/1990 | WIPO . |

OTHER PUBLICATIONS

N. Kavcar et al; "Characterization of CuInSe 2 Thin Films Produced by Thermal Annealing of Stacked Elemental Layers"; Solar Energy Materials and Solar Cells, vol. 27, pp. 13–23, 1992.

A. Rocket et al: "CuInSe2 for photovoltaic applications"; J. Appl. Phys. 70(7), 1 Oct. 1991; pp. R81–R97.

Patent Abstracts of Japan, vol. 16, No. 401 (E–1253) May 1992 re JP–A 4132233.

Patent Abstract of Japan, vol. 16, No. 554 (E–1293) Aug. 1992 re JP–A 4212430.

Primary Examiner—Shrive Beck
Assistant Examiner—Brian K. Talbot
Attorney, Agent, or Firm—Cushman, Darby & Cushman

[57] ABSTRACT

A chalcopyrite compound, for instance, $CuInS_2$ or $CuInSe_2$, is prepared by subjecting a thin film containing copper metal, indium metal, and an indium compound or a compound which contains both indium and copper, selected from the group consisting of oxides, sulfides and selenides, with heat under a reducing atmosphere containing at least one of the Group VIb element or under an atmosphere containing a reducing compound of at least one of the Group VIb element, thereby converting said thin film into a chalcopyrite compound.

13 Claims, 4 Drawing Sheets

PROCESS FOR PRODUCING CHALCOPYRITE TYPE COMPOUND THIN FILM

This is a continuation of application Ser. No. 08/138,213, filed on Oct. 20, 1993, which was abandoned upon the filing hereof.

FIELD OF THE INVENTION AND THE RELATED ART STATEMENT

1. Field of the Invention

The present invention relates to a process of producing a chalcopyrite compound thin film. More-particularly, it is concerned with a process of producing a chalcopyrite compound thin film for use in a thin film-type solar cell having a high energy conversion efficiency.

2. Description of the Prior Art

A chalcopyrite compound thin film used as an absorber layer of a solar cell is conventionally produced by using, for example, the following two step process illustrated in FIGS. 3(a) and 3(b). After depositing an electrode 12 of molybdenum (Mo) or the like on a substrate 11, a copper (Cu) thin film 13 and an indium (In) thin film 14 are laminated on the electrode 12 in a manner that the ratio of the film thickness of the copper thin film 13 to that of the indium thin film 14 is in 1:2.2 to 2.4. The substrate is then subjected to a heat treatment under a charcogen atmosphere including, for instance, selenium (Se) or sulfur (S) or under charcogen-containing gas, for instance, $H_2Se$ or $H_2S$, thereby to obtain a thin film of $CuInSe_2$ or $CuInS_2$ as the thin film 15 of the chalcopyrite compound.

Another conventional example is as follows:

As shown in FIGS. 4(a) and 4(b), similarly to that shown in FIGS. 3(a) and 3(b) after forming a laminated film of the Cu thin film 13 and the In thin film 14 on the electrode 12 of the substrate 11, a charcogen thin film 16 of, for instance, Se, tellurium (Te) or the like, is vapor-deposited on the thin films of Cu and In. Then, the vapor-deposited substrate is subjected to a heat treatment, to produce a thin film of $CuInSe_2$ or $CuInTe_2$ as the thin film 17 of the chalcopyrite compound in a solid-phase reaction.

Major subjects to be improved in a conventional process of producing chalcopyrite compounds such as $CuInS_2$, $CuInSe_2$ and the like are, deviation or scattering of composition ratio of Cu to In and microscopic heterogeneity of composition in the resultant compounds. Since electrical characteristics of the chalcopyrite compound depends largely on its composition, the above-mentioned deviation or scattering of composition and microscopic heterogeneity of composition are dominant causes for deteriorating the electric characteristics of the chalcopyrite compound. And particularly, this trend is remarkable in, for instance, the solar cell which is fabricated by laminating the thin films.

However, in the conventional process of producing the chalcopyrite compound, it has been difficult to control the composition strictly. For example, when the thin film containing Cu and In at an atomic ratio of about 1:1 is heated thereby to make a part of Cu and In be alloyed by reaction, the atomic ratio of In/Cu in the alloy is less than one (1), and In remains unreacted. Since the melting point of In is below the producing temperature of the chalcopyrite compound, when the laminated film of the Cu thin film and In thin film is subjected to a heat treatment under the atmosphere of, for instance, Se or S or the like, or under the atmosphere of $H_2S$, $CS_2$ or $H_2S$, then the In is molten and the molten In aggregates to form a large number of liquid drops. Therefore, the distribution state of In, which should be uniformly existed throughout the thin film, is brought to be heterogeneous. Thus, the chalcopyrite compound thin film obtained by the heat treatment of In and Cu becomes heterogeneous in the microscopic composition, and it was difficult to synthesize the chalcopyrite compound having a uniform composition.

In the process shown in FIGS. 3(a) and 3(b) and FIGS. 4(a) and 4(b), the variation or scattering in the composition is, particularly, due to conditions of the In thin film 14. That is, as indicated by S in FIGS. 3(a) and 3(b) and FIGS. 4(a) and 4(b), the surface condition of the conventional In thin film 14 becomes uneven after all. And hence, there is such a problem in the prior art production method that the microscopic variation is caused in the composition in the obtained thin film of the chalcopyrite compound.

OBJECT AND SUMMARY OF THE INVENTION

It is, therefore, an object of the present invention to provide a process of producing a chalcopyrite compound thin film that is immune from the deviation or scattering of composition and the microscopic variation of composition.

According to the present invention, there is provided a process of producing the chalcopyrite compound thin film, which comprises: treating a thin film containing copper (Cu) metal, indium (In) metal and In oxide, In sulfide or In selenide, or a thin film containing Cu metal, In metal and oxides, sulfides or selenides containing both Cu and In, with heat under a reducing atmosphere containing at least one of Group VIb element or under an atmosphere containing a reducing compound of at least one of the Group VIb element, thereby converting said film into the chalcopyrite compound.

A process of the present invention is such a synthesizing process of the chalcopyrite compound thin film, that forming a layer containing Cu metal, In metal and an In compound, or a layer containing Cu metal, In metal and compounds containing Cu and In, and thereafter atoms of Group VIb element are introduced into the layer.

The In compound, or the compounds containing Cu and In (hereinafter referred to as Cu.In complex compounds) used in the process of the present invention are the oxides, sulfides or selenides. When the layer containing such In compound or Cu.In complex compounds, Cu metal and In metal is heated, the metal components react with each other and such alloys as $Cu_{11}In_9$ and $Cu_9In_4$ are produced. The melting point of $Cu_{11}In_9$ is about 300° C. and the melting point of $Cu_9In_4$ is about 600° C. Meanwhile, the melting points of the In compounds in the layer are as follows: 1910° C. for $In_2O_3$, 1090° C. for $In_2S_3$, 890° C. for $In_2Se_3$ and above 1000° C. for $Cu_2In_2O_5$, $CuInS_2$ and $CuInSe_2$ of the Cu.In complex compounds.

Thus, a liquid phase containing a large amount of In below the producing temperature (about 250° C.) of the chalcopyrite phase is not produced, and the composition of the layer is kept uniform during the reaction. And hence, the chalcopyrite compound having the microscopically uniform composition and maintaining initial composition can be produced by the heat treatment under the reducing atmosphere containing the Group VIb element or under the atmosphere including the reducing compound of the Group VIb element.

The inventors have found out that, in the process of producing the chalcopyrite compounds such as $CuInS_2$ and CuInSe$_2$, the primary cause of difficulty in composition control and microscopic variation in the composition of the chalcopyrite compound is that, the In.Cu alloy whose atomic ratio In/Cu is above 1 does not exist, and the melting point (157° C.) of unreacted In is lower than the producing temperature (250° C.) of the chalcopyrite phase. On the contrary, the melting points of the In compounds such as In$_2$O$_3$, In$_2$S$_3$ or In$_2$Se$_3$ used in the invention are 1910° C., 1090° C. and 890° C., respectively, and are much higher than the melting point 157° C. of the In metal. Also the melting points of the Cu.In complex compounds such as Cu$_2$In$_2$O$_5$, CuInS$_2$ and CuInSe$_2$ are above 1000° C., and are much higher than the melting point 157° C. of the In metal.

Thus, there is, naturally, no problem of being molten and aggregating of the In metal at the producing temperature of the chalcopyrite compounds. That is, as one species of the present invention, the In metal, which remains unreacted when producing the Cu.In alloy by a heat treatment of the thin film containing Cu and In substantially at the atomic ratio of 1:1, is changed into oxides, sulfides or selenides having the high melting points beforehand. Thereby, the chalcopyrite compounds having the microscopically uniform composition and maintaining initially designed composition can be produced without resulting the liquid phase having a large amount of In below the producing temperature (about 250° C.) of the chalcopyrite phase.

The feature between and the respective characteristics of oxide, sulfide and selenide which are used in the present invention as the precursors for obtaining chalcopyrite compounds are as follows.

In case of using sulfide, the precursor can be readily obtained, so that this compound is suitable for forming a thin film having a large area. However, oxygen included in the In oxide changes into a gas such as H$_2$O or CO$_2$ when heat-treated in an atmosphere containing chalcogen, so that the resultant gas has to be removed outside the thin film.

In case of using sulfide, a precursor containing In sulfide can be easily obtained as a solid solution film as expressed as CuIn (S, Se)$_2$ by a heat treatment in an atmosphere containing Se. Moreover, CuInS$_2$ films of high purity are obtainable, since such precursor contains no impurity other than Cu, In and S.

In case of using selenide, because of the absence of impurity other than Cu, In and Se in the precursor, CuInSe$_2$ films of high purity can be obtained. Moreover, solid solution films as expressed as CuIn (S, Se)$_2$ are obtained by a heat treatment in an atmosphere containing S.

As stated above, according to the present invention, the uniform chalcopyrite compound thin film suitable for devices of a thin-film solar cell is obtained.

These and other advantages of the present invention will be understood clearly to those skilled in the art, from the following detailed description taken in connection with the accompanying drawings.

BRIEF DESCRIPTION OF THE DRAWINGS

FIG. 1 is a sectional view for illustrating a process of producing a chalcopyrite compound thin film in accordance with the present invention, wherein;

(a) shows a state where a thin film containing Cu metal, In metal and an In compound is formed on a substrate, and (b) shows a state where a chalcopyrite compound thin film is synthesized.

Figure 2:
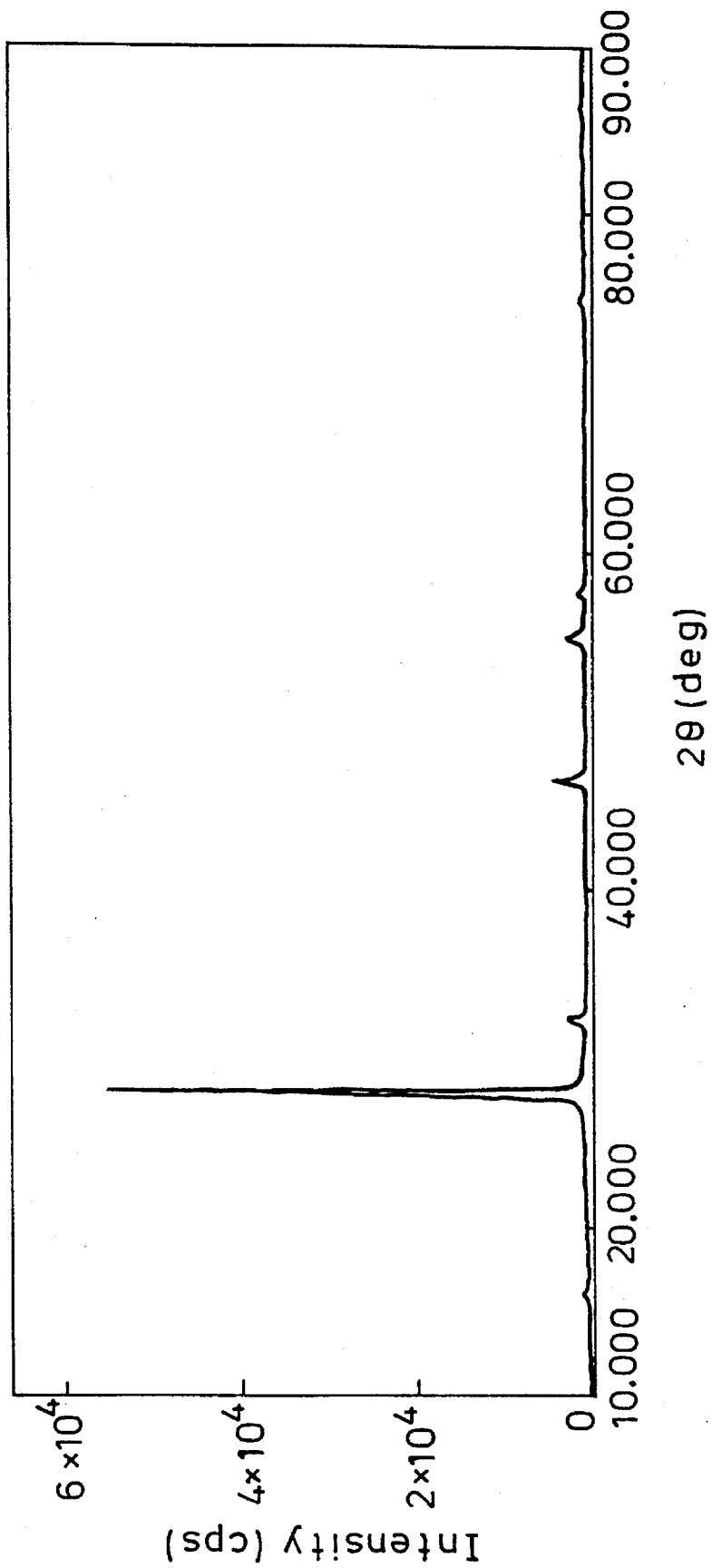

FIG. 2 shows an X-ray diffraction pattern of the chalcopyrite compound (CuInS$_2$) thin film obtained by one embodiment of the present invention.

Figure 3A:
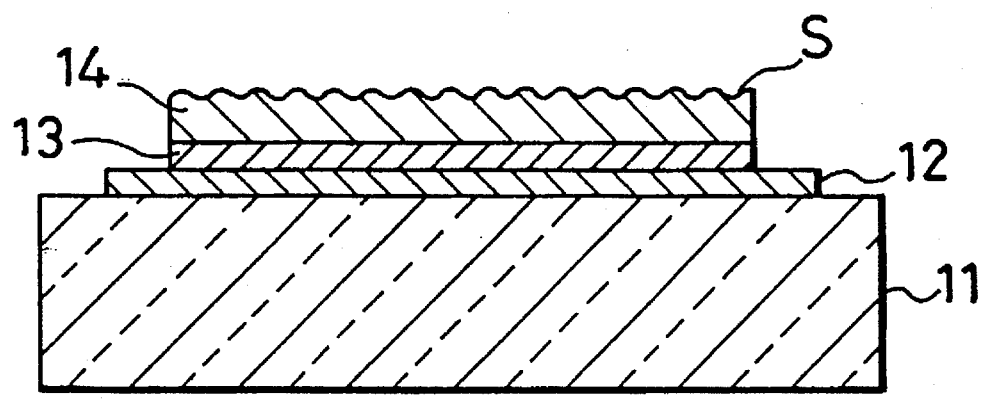
Figure 3B:
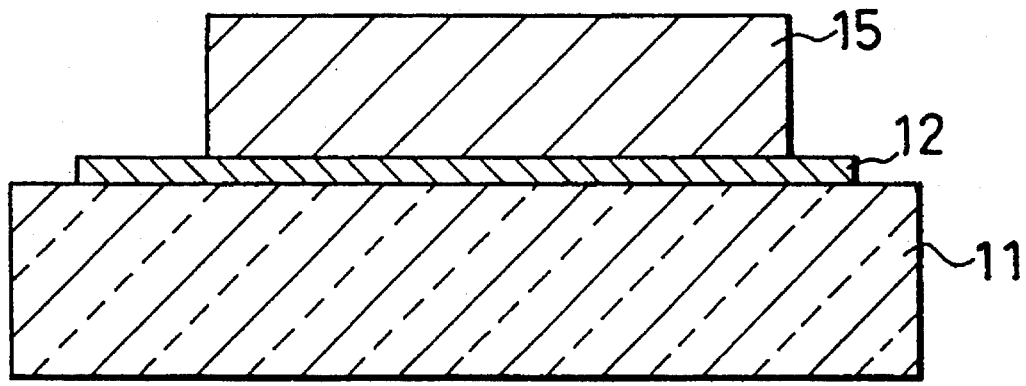

FIGS. 3(a) and 3(b) are sectional views showing a conventional process of producing a chalcopyrite compound thin film, wherein;

FIG. 3(a) shows a state where plural thin films each consisting of a Cu metal layer and an In metal layer are laminated on a substrate, and FIG. 3(b) shows a state were the chalcopyrite compound thin film is synthesized.

Figure 4A:
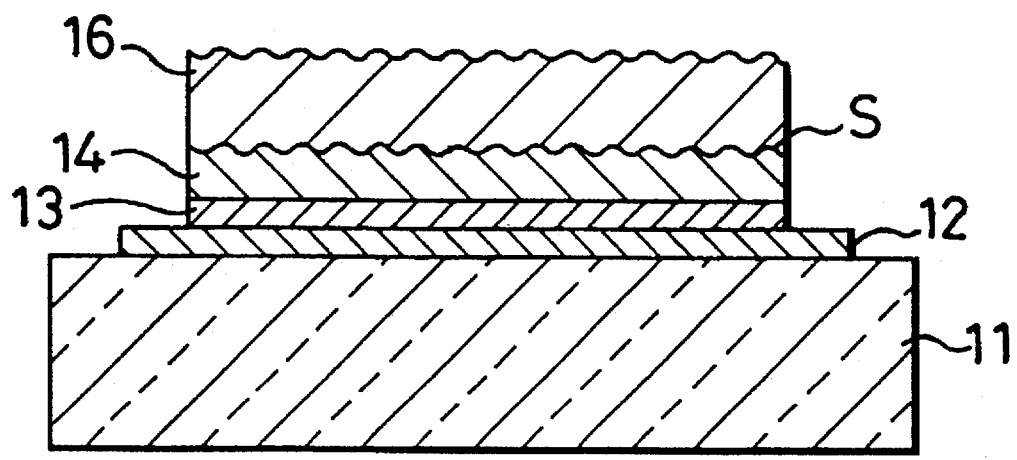
Figure 4B:
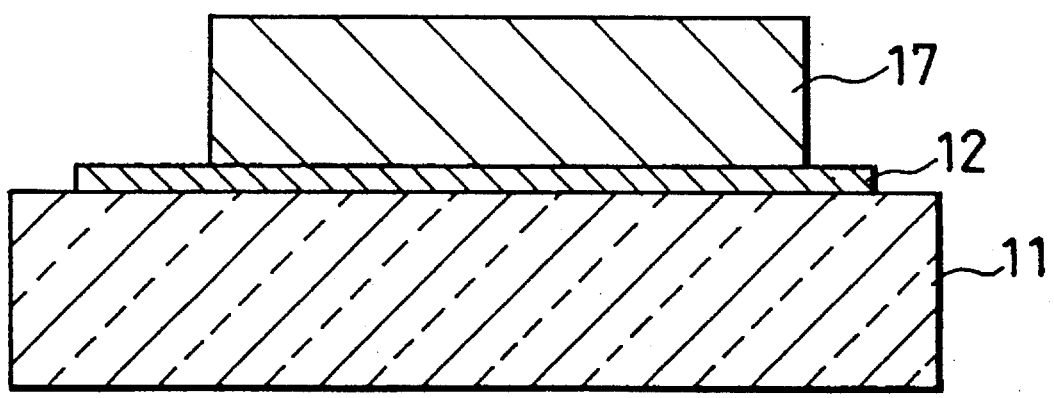

FIGS. 4(a) and 4(b) are sectional views showing a conventional process of producing a chalcopyrite compound thin film, wherein;

FIG. 4(a) shows a state where plural thin films each consisting of a Cu metal layer, an In metal layer and a chalcogen layer are laminated on a substrate, and FIG. 4(b) shows a state where a chalcopyrite compound thin film is synthesized.

It will be recognized that some or all of the Figures are schematic representations for purposes of illustration and do not necessarily depict the actual relative sizes or locations of the elements shown.

DETAILED DESCRIPTION OF THE PREFERRED EMBODIMENTS

In the following, the preferred embodiments of the present invention are particularly described with reference to the accompanying drawings.

FIG.1 shows a process of obtaining a chalcopyrite compound thin film according to the present invention.

Figure 1A:
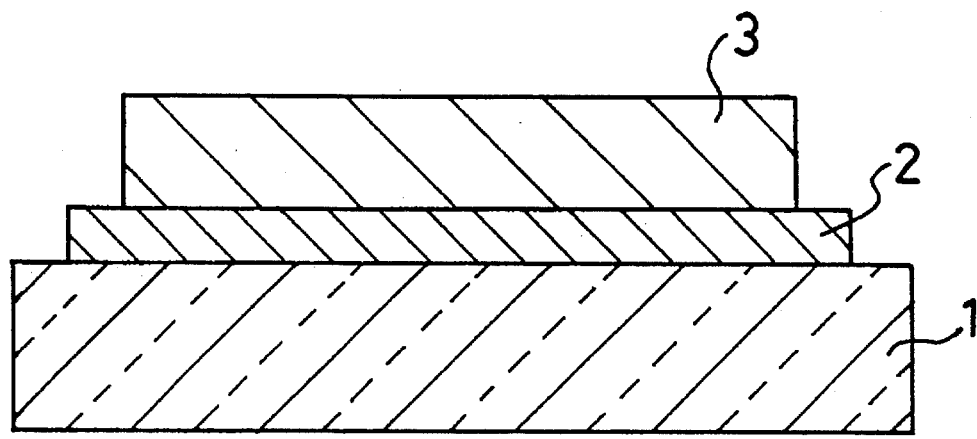
Figure 1B:
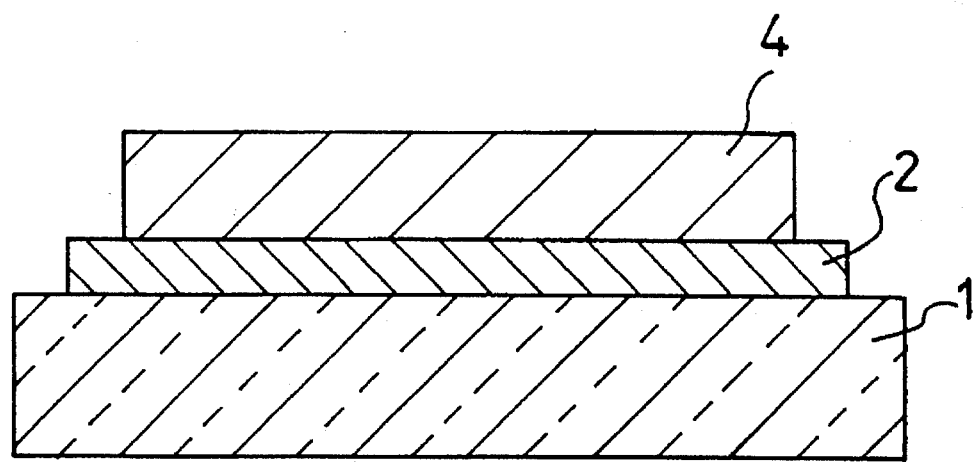

As shown in FIG. 1, a thin film 2 of molybdenum (Mo) or the like is deposited on a substrate 1 consisting of glass or the like. In one embodiment of the present invention, a Cu metal layer, an In metal layer and an In compound layer are formed in this order on the thin film 2 (FIG. 1(a)), to form a composite thin film 3 consisting of the above-mentioned three layers. The Cu metal layer, the In metal layer and the In compound layer may be formed in other order. But in any case, the In metal should be formed between the Cu metal and the In compound in order to put the In layer inside thereby to make as much In as possible alloy with Cu.

In another embodiment of the present invention, the thin film 3 is formed by alternate formings of the Cu metal, In metal and Cu.In complex compounds.

Furthermore, in place of the Cu metal and the In metal, a Cu.In alloy may be employed. The Cu.In alloy is preferably of a Cu$_{11}$In$_9$ phase alloy.

Next, heat treatment is carried out for the resultant substrate formed with the thin film 3 under a reducing atmosphere containing the Group VIb element, or under an atmosphere containing a reducing compound of the Group VIb element. Then the thin film 3 is converted into a chalcopyrite compound thin film 4 (FIG. 1(b)).

Heat treatment temperature of the thin film 3 under the reducing atmosphere containing the Group VIb element, or under the atmosphere containing the reducing compound of the Group VIb element is preferably within the range of, usually, 250° C. to 700° C., more preferably within the range of 400° C. to 600° C. In case the heat treatment temperature is below 250° C., sufficient chalcopyritization can not be expected. It is desirable to perform the heat treatment at a temperature of 400° C. or above, in order to surely make the chalcopyritization.

The upper limit of heat treatment temperature is restricted by the melting points of the chalcopyrite compounds to be synthesized. By the way, the melting points of CuInS$_2$ and $CuInSe_2$ are above 900° C. Therefore, in the case of producing the chalcopyrite compound thin film by the process of the present invention, usually, the upper limit of the heat treatment temperature is determined by the heat resistance property of the substrate being used. When soda-lime glass is used as the substrate, the heat treatment temperature is preferably below 600° C., and when borosilicate glass is used as the substrate, the heat treatment temperature is also preferably below 700° C.

The heat treatment time may be adequately varied corresponding to the thickness of the thin film being treated and the heat treatment temperature. When the film thickness is thin and the heat treatment temperature is high, the required chemical reactions proceeds sufficiently in a short time and the intended chalcopyrite compound is obtained. Conversely, when the film thickness is thick and the heat treatment temperature is low, the longer heat treatment time is required.

In the process of producing the chalcopyrite compounds of the present invention, atomic ratio In/Cu of the In metal and the Cu metal in the layer containing of the Cu metal, In metal and In compound or Cu.In complex compounds, is preferably 9/11 or below. This is because that, a Cu.In alloy having the achievable highest content ratio of In is $Cu_{11}In_9$, and when the atomic ratio In/Cu exceeds 9/11 the undesirable un-alloyed In metal remains in the layer. However, from a viewpoint of uniformity of the composition in the compound obtained, even the existence of the slightest In compound or Cu.In complex compounds sufficiently improve the uniformity of composition. For the atomic ratio In/Cu of 9/11 or below, it is admissible even in the case that a part of Cu and In metal composition form mixed crystal, solid solution or alloy compounds.

Now, in the present invention, when a single substance metal is used as In and Cu, an alloy of Cu and In is produced by the metals as temperature rises in the heat treatment. Thus, in order to uniform the film composition further, it is to be understood that the Cu.In alloy is, preferably, produced from the Cu metal and In metal beforehand. The Cu.In alloy preferably contains Cu and In possibly at the atomic ratio of 1:1. This is because by selecting such composition ratio, a $Cu_{11}In_9$ phase having the composition ratio close to that of Cu and In is obtainable in the resultant chalcopyrite compound.

In the process of producing the chalcopyrite compound of the present invention, structures of In oxides, In sulfides or In selenides which are used as the In compound, or oxides containing Cu and In, sulfides containing Cu and In or selenides containing Cu and In used as the Cu.In complex compounds may be of crystalline or amorphous. However, when the In compound or the Cu.In complex compounds is amorphous, the crystal size of the chalcopyrite compound obtained by the heat treatment under the reducing atmosphere containing the Group VIb element, or under the atmosphere containing the reducing compound of the Group VIb element becomes larger. Therefore, this type of chalcopyrite compound is suitable for use as semiconductor devices of a solar cell or the like devices.

The Cu.In complex compounds layer may be constituted by a mixture of said complex compounds and the In compound.

As the reducing compound of the Group VIb element which can be applicable to the present invention, $H_2S$, $CS_2$, $H_2Se$, $(CH_3)_2Se$, $(C_2H_5)_2Se$ and the like may be exemplified. Also, the Group VIb element or the reducing compound of the Group VIb element applicable to the present invention may be of a single species or a plurality of species. These elements may suitably be selected in compliance with the producing conditions. By the way, since $S_2Se$ used in preparing $CuInSe_2$ is toxic, it is desirable instead to use organic selenides such as $(CH_3)_2Se$ and $(C_2H_5)_2Se$ for the safety sake.

In the producing process of the present invention, the reducing atmosphere containing the Group VIb element or the atmosphere containing the reducing compound of the Group VIb element for a heat treatment of the thin film 3 may be selected from in any state of the followings: a mixed atmosphere of vapor of the Group VIb element such as S or Se and reducing gas such as $H_2$ and the like; a mixed atmosphere of vapor of the Group VIb element such as S, reducing gas such as $H_2$ and/or the reducing compound of the Group VIb element such as $H_2S$; or an atmosphere of the reducing compound of the Group VIb element such as $H_2S$. However, in a case of using In oxide, there is a need of making a reducing atmosphere by using $H_2$, Co or the like together with the Group VIb element.

In the present invention, as the method for obtaining the thin film containing the Cu metal, In metal and In compound or Cu.In complex compounds, any method known to those skilled in the art as the thin film technology may be employed. It is to be noted that the method enumerated below is only exemplary and any other method can also be applicable to the present invention.

(1) A method of preparing a Cu layer by the electron-beam evaporation and an In layer thereon similarly by the electron-beam evaporation, and preparing a layer of oxide, sulfide or selenide of In or Cu and In thereon by the sputtering, laser ablation method or the like.

(2) A method of preparing a Cu layer by the ion-beam sputtering method and an In layer thereon similarly by the ion-beam sputtering method, and preparing a layer of oxide, sulfide or selenide of In or Cu and In thereon by the sputtering, laser ablation method or the like.

(3) A method of preparing a Cu.In alloy layer by the simultaneous ion-beam sputtering method of Cu and In, and preparing a layer of oxide, sulfide or selenide of In or Cu and In thereon by the sputtering, laser ablation method or the like.

EXAMPLE 1

A glass substrate is used as a substrate. First, a Cu layer is deposited on the substrate at a thickness of 2500 angstrom by electron-beam evaporation, and an In layer is deposited thereon at a thickness of 4000 angstrom by electron-beam evaporation, and further, an indium oxide film (In-O film) is deposited thereon at a thickness of 2500 angstrom by a laser ablation method using a target of sintered $In_2O_3$, thereby to obtain a multi-layer film. During the above deposition processes, the temperature of the substrate is kept at room temperature.

The resultant Cu/In/In-O multi-layer film is analyzed by ICP emission spectroscopy to obtain the atomic ratio of Cu:In of 1:1. Only diffraction lines of Cu and In are observed as a result of analysis on the multi-layer film by X-ray diffraction. From this fact, it is understood that the In-O film is amorphous. When a section of the Cu/In/In-O thin film is observed by a scanning electron microscopic photograph, the resultant thin film is very uniform.

The multi-layer thin film is then subjected to a heat treatment at a temperature of 400° C. for 2 hours under a $H_2S$ atmosphere (5% of $H_2S$+95% of $N_2$). An X-ray diffraction pattern of the resultant Cu-In-S thin film is shown in FIG. 2. From the X-ray diffraction pattern, it is understood that, the obtained Cu-In-S thin film is a single phase chalcopyrite compound thin film having a chalcopyrite crystal structure, namely a CuInS$_2$ thin film.

When the obtained thin film is analyzed by ICP emission spectroscopy, it is confirmed that the atomic ratio of Cu:In:S equals to 1:1:2. Furthermore, an investigation on two dimensional distribution of respective elements in the thin film by using an X-ray microanalyzer shows that, the Cu-In-S thin film has a microscopically uniform composition. It is also confirmed by the scanning electron microscopic observation that crystal grains of CuInS$_2$ have grown sufficiently.

EXAMPLE 2

In this example, a process of producing a chalcopyrite compound thin film to be used in a solar cell is shown. A glass substrate is used as the substrate and a molybdenum film serving as a base electrode is deposited thereon at a thickness of about 1 μm by sputtering. Similarly to Example 1, Cu and In are deposited respectively at a thickness of 2500 angstrom and 4000 angstrom on the Mo film at room temperature by ion-beam sputtering. An In-O thin film is deposited thereon at a thickness of 2500 angstrom by magnetron sputtering of a sintered target of In$_2$O$_3$. In such a manner, a multi-layer thin film 3 as shown in FIG. 1(a) is obtained. At the time of producing the In-O film, the temperature of the substrate is maintained at 250° C.

When analyzing the resultant Cu/In/In-O thin film by ICP emission spectroscopy, the atomic ratio of Cu:In equals to 1:1. When the multi-layer film is analyzed by X-ray diffraction, diffraction lines of Cu, Cu.In alloy and In$_2$O$_3$ are observed, and thereby it is understood that the multi-layer film is a mixture of Cu, Cu.In alloy and In$_2$O$_3$. Furthermore, an observation of the Cu/In/In-O thin film by scanning electron microscope shows that the surface is flat and uniform.

The multi-layer thin film is then subjected to a heat treatment for 2 hours at a temperature of 500° C. under a H$_2$S atmosphere similar to that used in Example 1. When the obtained Cu-In-S thin film is analyzed by an X-ray diffraction pattern, it is understood that the film is a single-phase chalcopyrite compound thin film having a chalcopyrite crystal structure, namely CuInS$_2$. It is also confirmed by the analysis by ICP emission spectroscopy, that the atomic ratio of Cu:In:S equals to 1:1:2. Meanwhile, an investigation on two dimensional distribution of respective elements in the thin film by an X-ray microanalyzer confirms, that the Cu-In-S thin film has a microscopically uniform composition. It is also observed and confirmed by scanning electron microscope, that crystal grains of the chalcopyrite compound have grown sufficiently. It is also understood, that the thin film of the chalcopyrite compound has a sufficient adhesiveness with the molybdenum which had previously been raised as an unsolved problem in the prior art.

EXAMPLE 3

A CuInS$_2$ thin film is produced in the same manner as that in Example 1. However, as the substrate, the same one as Example 2 is used, which is prepared by depositing molybdenum on the glass substrate at a thickness of about 1 μm by electron-beam evaporation. Differences of this Example 3 from Example 1 are that, in place of forming the Cu film and In film, a Cu$_{11}$In$_9$ alloy film is deposited at a thickness of 6500 angstrom by ion-beam sputtering and that, in place of the mixed gas of H$_2$S and N$_2$ introduced during the heat treatment, N$_2$ gas bubbled in CS$_2$ is used.

Also in this case, a single-phase chalcopyrite compound thin film namely the CuInS$_2$ thin film is obtained similarly to Example 1. By analyses using X-ray diffraction, scanning electron microscope, X-ray micro-analyzer and the like, it is understood that the resultant chalcopyrite compound thin film has a very uniform composition, crystal grains have grown sufficiently and adhesiveness with Mo is good.

EXAMPLE 4

A CuInS$_2$ thin film is produced in the same manner as that in Example 1. However, as the substrate, the same one as Example 2 is used, which is prepared by depositing molybdenum on the glass substrate at a thickness of about 1 μm by electron-beam evaporation. Differences of this Example 4 from Example 1 are that, an In-S film is deposited at a thickness of 4000 angstrom by the laser ablation method using a target of In$_2$S$_3$ in place of In$_2$O$_3$ and that, the multi-layer thin film is reacted with sulfur (S) vapor at a temperature of 400° C. under a vacuum of 10$^{-4}$ Torr.

Also in this case, similarly to Example 1, a single-phase CuInS$_2$ thin film is obtained. By analyses using X-ray diffraction, scanning electron microscope, X-ray microanalyzer and the like, it is understood that the resultant chalcopyrite compound thin film has a very uniform composition, crystal grains have grown sufficiently and adhesiveness with Mo is good.

EXAMPLE 5

A CuInSe$_2$ thin film is produced in the same manner as that in Example 1. However, as the substrate, the same one as Example 2 is used, which is prepared by depositing molybdenum on the glass substrate at a thickness of about 1 μm by electron-beam evaporation. Differences of this Example 5 from Example 1 are that, in place of In$_2$O$_3$, InSe$_3$ is used as a target and that, mixed gas of H$_2$Se and N$_2$ (H$_2$Se:N$_2$=1:20 by volume) is introduced during the heat treatment.

Also in this case, similarly to Example 1, a single phase CuInSe$_2$ thin film is obtained. By analyses using X-ray diffraction, scanning electron microscope, X-ray microanalyzer and the like, it is understood that the resultant chalcopyrite compound thin film has a very uniform composition, crystal grains have grown sufficiently and adhesiveness with Mo is good.

EXAMPLE 6

A CuIn(S, Se)$_2$ solid solution thin film is produced in the same manner as that in Example 1. However, as the substrate, the same one as Example 2 is used, which is prepared by depositing molybdenum on the glass substrate at a thickness of about 1 μm by electron-beam evaporation. Difference of this Example 6 from Example 1 is that, a In-Se film is deposited at a thickness of 5000 angstrom by using a target of In$_2$Se$_3$ in place of In$_2$O$_3$.

Also in this case, similarly to Example 1, a single-phase CuIn(S, Se)$_2$ solid solution thin film is obtained. By analyses using X-ray diffraction, scanning electron microscope, X-ray microanalyzer and the like, it is understood that the resultant chalcopyrite compound thin film has a very uniform composition, crystal grains have grown sufficiently and adhesiveness with Mo is good.

EXAMPLE 7

A glass substrate, onto which molybdenum is deposited at a thickness of about 1 μm by sputtering, is used as the substrate. Similarly to Example 2, Cu and In are respectively deposited on Mo of the substrate at a thickness of 2500 angstrom and 4000 angstrom by ion-beam sputtering, and an In-O thin film is deposited thereon at a thickness of 2500 angstrom by magnetron sputtering of a sintered $In_2O_3$ target. A Cu-In-O thin film is further deposited thereon at a thickness of 0.3 μm by the laser ablation method using a target of sintered $Cu_2In_2O_5$. During the Cu-In-O film deposition process, the temperature of the substrate is maintained at room temperature.

When the resultant Cu/In/In-O/Cu-In-O thin film is analyzed, the atomic ratio of Cu:In equals to 1:1. When the multi-layer thin film or Cu/In/In-O/Cu-In-O thin film is analyzed by X-ray diffraction, diffraction lines are observed only for Cu and Cu.In alloy, and it is understood that In oxide and Cu.In oxides are amorphous. Furthermore, when the Cu/In/In-O/Cu-In-O thin film is observed by scanning electron microscope, the surface is flat and uniform.

The substrate including the multi-layer thin film and molybdenum is subjected to a heat treatment at a temperature of 500° C. under a $H_2S$ atmosphere for 2 hours. The Cu-In-S thin film thus obtained is analyzed by X-ray diffraction, and it is confirmed that the film is made of single-phase $CuInS_2$ having the chalcopyrite crystal structure. By analysis by ICP emission spectroscopy, it is confirmed that the atomic ratio of Cu:In:S equals to 1:1:2. Furthermore, an investigation on two dimensional distribution of respective elements in the thin film by an X-ray microanalyzer confirms that the Cu-In-S thin film has the microscopically uniform composition. Besides, from the scanning electron microscopic observation, it is also confirmed that crystal grains of the chalcopyrite compound have grown sufficiently. It is understood that adhesiveness of the chalcopyrite compound thin film and a molybdenum electrode, which was problematic hitherto, is sufficient, and there is no problem when applying in, for example, devices of a solar cell and the like.

EXAMPLE 8

A $CuInS_2$ thin film is produced in the same manner as that in Example 7 on a glass substrate having the same molybdenum electrode as Example 7. Differences of this Example 8 from Example 7 are that, a In-S film is deposited at a thickness of 4000 angstrom by using a target of $In_2S_3$ in place of $In_2O_3$, that in place of forming the Cu-In-O thin film, the Cu-In-S thin film is formed at a thickness of 0.5 μm by sputtering of a $CuInS_2$ target, and that the Cu/In/In-S/Cu-In-S multi-layer thin film thus produced is made reacted with sulfur (S) vapor at a temperature of 400° C. under a vacuum of $10^{-4}$ Torr.

Also in this example, similarly to Example 7, a single-phase $CuInS_2$ thin film is obtained. As the result of analyses using X-ray diffraction, scanning electron microscope, X-ray microanalyzer and the like, the resultant chalcopyrite compound has a very uniform composition, crystal grains have grown sufficiently and adhesiveness with the molybdenum electrode is good.

EXAMPLE 9

In the same manner as that in Example 7, a $CuIn(S, Se)_2$ thin film is produced on a glass substrate having the same molybdenum layer as Example 7. Differences of this Example 9 from Example 7 are that, a In-Se film is deposited at a thickness of 5000 angstrom by using a target of $In_2Se_3$ in place of $In_2O_3$, and that in place of depositing the Cu-In-O thin film, a Cu-In-Se thin film is deposited at a thickness of 0.5 μm by sputtering of a $CuInSe_2$ target.

In the same manner as that in Example 7, the multi-layer thin film is made reacted with $H_2S$, thereby to obtain a single-phase $CuIn(S, Se)_2$ solid solution thin film. As the result of analyses using X-ray diffraction, scanning electron microscope, X-ray micro-analyzer and the like, the resultant chalcopyrite compound thin film has a very uniform composition, crystal grains have grown sufficiently and adhesiveness with the molybdenum electrode is good.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A process for producing a Cu-In-Group VI chalcopyrite film, which comprises: treating a film containing (1) copper metal, (2) indium metal, and (3) an indium compound selected from the group consisting of oxides, sulfides and selenides, with heat under a reducing atmosphere containing at least one of a Group VIb element or under an atmosphere containing a reducing compound of at least one of a Group VIb element, wherein an atomic ratio In/Cu of indium metal to copper metal in said film prior to heating is $In/Cu \leq 9/11$, thereby converting said film into a Cu-In-Group VI chalcopyrite compound.

2. A process of producing a Cu-In-Group VI chalcopyrite film, which comprises: treating a film containing (1) copper metal, (2) indium metal, and (3) a compound containing copper and indium selected from the group consisting of oxides, sulfides and selenides, with heat under a reducing atmosphere containing at least one of a Group VIb element or under an atmosphere containing a reducing compound of at least one of a Group VIb element, wherein an atomic ratio In/Cu of indium metal to copper metal in said film prior to heating is $In/Cu \leq 9/11$, thereby converting said film into a Cu-In-Group VI chalcopyrite compound.

3. The process of claim 1 or claim 2, wherein copper metal and indium metal are present as an alloy of copper and indium.

4. The process of claim 3, wherein said alloy is a $Cu_{11}In_9$ alloy.

5. The process of claim 1, wherein said indium compound is noncrystalline.

6. The process of claim 2, wherein said compound containing copper and indium is noncrystalline.

7. A process of producing a Cu-In-Group VI chalcopyrite film, which comprises: treating a film containing (1) copper metal, (2) indium metal, and (3) a mixture of (3a) a compound containing copper and indium selected from the group consisting of oxides, sulfides and selenides, and of (3b) an indium compound selected from the group consisting of oxides, sulfides and selenides, with heat under a reducing atmosphere containing at least one of a Group VIb element or under an atmosphere containing a reducing compound of at least one of a Group VIb element, thereby converting said film into a Cu-In-Group VI chalcopyrite compound.

8. The process of any one of claim 1 or 2, wherein said reducing compound of the Group VIb element is at least one selected from the group consisting of $H_2S$, $CS_2$, $H_2Se$, $(CH_3)_2Se$ and $(C_2H_5)_2Se$.

9. The process of any one of claim 1 or 2, wherein said Group VIb element is at least one selected from the group consisting of S and Se.

10. The process of any one of claim 1 or 2, wherein said heat treatment is performed at a temperature of 250° C. to 700° C.

11. The process of claim 10, wherein said heat treatment is performed at a temperature of 400° C. to 600° C.

12. The process of claim 7, wherein copper metal and indium metal are present as an alloy of copper and indium.

13. The process of claim 7, wherein said compound containing copper and indium is noncrystalline.

* * * * *